United States Patent
Liu et al.

(10) Patent No.: US 12,078,791 B2
(45) Date of Patent: Sep. 3, 2024

(54) METHOD FOR TILTING CHARACTERIZATION BY MICROSCOPY

(71) Applicant: Yangtze Memory Technologies Co., Ltd., Hubei (CN)

(72) Inventors: Jun Liu, Wuhan (CN); Yu Li, Wuhan (CN); Yi Li, Wuhan (CN); Yingfei Wang, Wuhan (CN); Shiyan Wu, Wuhan (CN); Qiangmin Wei, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 365 days.

(21) Appl. No.: 17/451,498

(22) Filed: Oct. 20, 2021

(65) Prior Publication Data
US 2023/0073472 A1    Mar. 9, 2023

Related U.S. Application Data

(63) Continuation of application No. PCT/CN2021/116411, filed on Sep. 3, 2021.

(51) Int. Cl.
G02B 21/36    (2006.01)
G02B 21/16    (2006.01)
H01J 37/26    (2006.01)

(52) U.S. Cl.
CPC .......... G02B 21/367 (2013.01); G02B 21/16 (2013.01); H01J 37/261 (2013.01); *H01J 2237/2802* (2013.01)

(58) Field of Classification Search
CPC .... G02B 21/16; G02B 21/367; G02B 21/365; G02B 21/36; H01J 37/261; H01J 37/26; H01J 2237/2802
See application file for complete search history.

(56) References Cited

U.S. PATENT DOCUMENTS 8,569,693 B2 * 10/2013 Bischoff .............. H01J 37/153
                                                          250/311

FOREIGN PATENT DOCUMENTS

| CN | 102737933 A | 10/2012 | |
|----|-------------|---------|---|
| CN | 107113363 A | 8/2017 | |
| CN | 109154495 A | 1/2019 | |
| JP | 11-101724 A | 4/1999 | |
| JP | 2003-173109 A | 6/2003 | |
| JP | 2012-165220 A | 8/2012 | |
| JP | 2012165220 | * 8/2012 | .............. G06T 3/00 |

OTHER PUBLICATIONS

International Search Report issued Mar. 29, 2022 in PCT/CN2021/116411 filed Sep. 3, 2021, 5 pages.

* cited by examiner

*Primary Examiner* — Tuan H Nguyen

(74) *Attorney, Agent, or Firm* — Oblon, McClelland, Maier & Neustadt, L.L.P.

(57) ABSTRACT

Aspects of the disclosure provide a method of tilting characterization. The method includes measuring a first tilting shift of structures based on a first disposition of the structures. The structures are formed in a vertical direction on a horizontal plane of a product. A second tilting shift of the structures is measured based on a second disposition of the structures. The second disposition is a horizontal flip of the first disposition. A corrected tilting shift is determined based on the first tilting shift and the second tilting shift.

18 Claims, 11 Drawing Sheets

$$\vec{S2} = \vec{d} - \vec{r}$$

METHOD FOR TILTING CHARACTERIZATION BY MICROSCOPY

RELATED APPLICATION

This application is a bypass continuation of International Application No. PCT/CN2021/116411, filed on Sep. 3, 2021. The entire disclosure of the prior application is hereby incorporated by reference in its entirety.

TECHNICAL FIELD

This disclosure relates to microscopy and, more specifically, to correcting distortion in microscopy.

BACKGROUND

Microscopy is the use of microscopes to view objects or areas of objects which cannot be seen by naked human eyes. Microscopy is widely used in a variety of applications, such as microelectronics inspection, in vitro diagnostics, cell sorting and counting (cytometry), 3D imaging or other technical areas where small size and high precision matter. Among the most commonly used microscopes are optical microscopes and electron microscopes. Optical microscopes use visible light and transparent lens to see objects such as human hair, blood cells, etc. Electron microscopes, such as transmission electron microscopes (TEM), use a beam of electrons and electro-lens to focus the electrons and can provide atomic resolution. TEM is particularly important for microelectronics inspection. Microelectronic technologies, such as three dimensional (3D) NAND flash memory technology, often necessitates the fabrication of microscopic structures which can be as small as a few nanometers or even smaller.

SUMMARY

Aspects of the disclosure provide a method of tilting characterization by a microscope.

According to some aspects, a method of tilting characterization is provided. The method includes measuring a first tilting shift of structures based on a first disposition of the structures. The structures are formed in a vertical direction on a horizontal plane of a product. A second tilting shift of the structures is measured based on a second disposition of the structures. The second disposition is a horizontal flip of the first disposition. A first corrected tilting shift is determined based on the first tilting shift and the second tilting shift.

In some embodiments, the measuring the first tilting shift of the structures includes capturing a first image of a first cross section of the product. The first cross section includes the structures of the first disposition. Image analysis of the first image is performed to measure the first tilting shift of the structures.

In some embodiments, the measuring the second tilting shift of the structures includes flipping the first cross section to obtain a flipped first cross section that includes the structures of the second disposition. A second image of the flipped first cross section is captured. Image analysis of the second image is performed to measure the second tilting shift of the structures.

In some embodiments, the measuring the second tilting shift of the structures includes capturing a second image of a second cross section of the product. The second cross section includes the structures of the second disposition. Image analysis of the second image is performed to measure the second tilting shift of the structures.

In some embodiments, at least one of the first corrected tilting shift or a first distortion-induced shift is determined based on a scalar operation of the first tilting shift and the second tilting shift.

In some embodiments, at least one of the first corrected tilting shift or a first distortion-induced shift is determined based on a vector operation of the first tilting shift and the second tilting shift.

In some embodiments, the first corrected tilting shift is determined using a formula, $$\vec{r}_1 = \frac{\vec{S1} - \vec{S2}}{2}.$$

$\vec{r}_1$ is the first corrected tilting shift. $\vec{S1}$ is the first tilting shift, and $\vec{S2}$ is the second tilting shift.

In some embodiments, the first distortion-induced shift is determined using a formula, $$\vec{d}_1 = \frac{\vec{S1} + \vec{S2}}{2}.$$

$\vec{d}_1$ is the first distortion-induced shift. $\vec{S1}$ is the first tilting shift, and $\vec{S2}$ is the second tilting shift.

In some embodiments, a third tilting shift of the structures is measured based on a third disposition of the structures. The third disposition is substantially perpendicular to the first disposition. A fourth tilting shift of the structures is measured based on a fourth disposition of the structures. The fourth disposition is a horizontal flip of the third disposition. A second corrected tilting shift is determined based on the third tilting shift and the fourth tilting shift.

In some embodiments, at least one of the second corrected tilting shift or a second distortion-induced shift is determined based on a vector operation of the third tilting shift and the fourth tilting shift.

In some embodiments, a tilting-induced shift of the structures in the horizontal plane is determined based on a vector operation of the first corrected tilting shift and the second corrected tilting shift.

In some embodiments, the tilting-induced shift of the structures in the horizontal plane is determined using a formula, $\vec{r}_H = \vec{r}_1 + \vec{r}_2$. $\vec{r}_H$ is the tilting-induced shift of the structures in the horizontal plane. $\vec{r}_1$ is the first corrected tilting shift, and $\vec{r}_2$ is the second corrected tilting shift.

$$|\vec{r_H}| = |\vec{r_1} + \vec{r_2}| = \sqrt{|\vec{r_1}|^2 + |\vec{r_2}|^2}.$$

In some embodiments, the second corrected tilting shift is determined using a first formula, $$\vec{r_2} = \frac{\vec{S3} - \vec{S4}}{2},$$

and the second distortion-induced shift is determined using a second formula, $$\vec{d_2} = \frac{\vec{S3} + \vec{S4}}{2}.$$

$\vec{r}_2$ is the second corrected tilting shift. $\vec{d}_2$ is the second distortion-induced shift. $\vec{S3}$ is the third tilting shift, and $\vec{S4}$ is the fourth tilting shift.

In some embodiments, a tilting-induced shift of the structures in the horizontal plane is determined based on a scalar operation of the first corrected tilting shift and the second corrected tilting shift.

In some embodiments, the product includes a vertical NAND memory device.

In some embodiments, the structures include at least one of a word line contact, a channel, a dummy channel or a gate line slit of the vertical NAND memory device.

In some embodiments, the first tilting shift of the structures and the second tilting shift of the structures are measured by a microscope.

In some embodiments, the microscope includes at least one of a transmission electron microscope (TEM), a scanning electron microscope (SEM), an X-ray microscope, an optical microscope or a fluorescence microscope.

In some embodiments, the microscope includes a TEM. The first cross section is obtained by ultramicrotomy, cryo ultramicrotomy, focused ion beam, ion etching, tripod polishing or electrochemical processing.

In some embodiments, the first cross section has a thickness of less than 200 nm.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
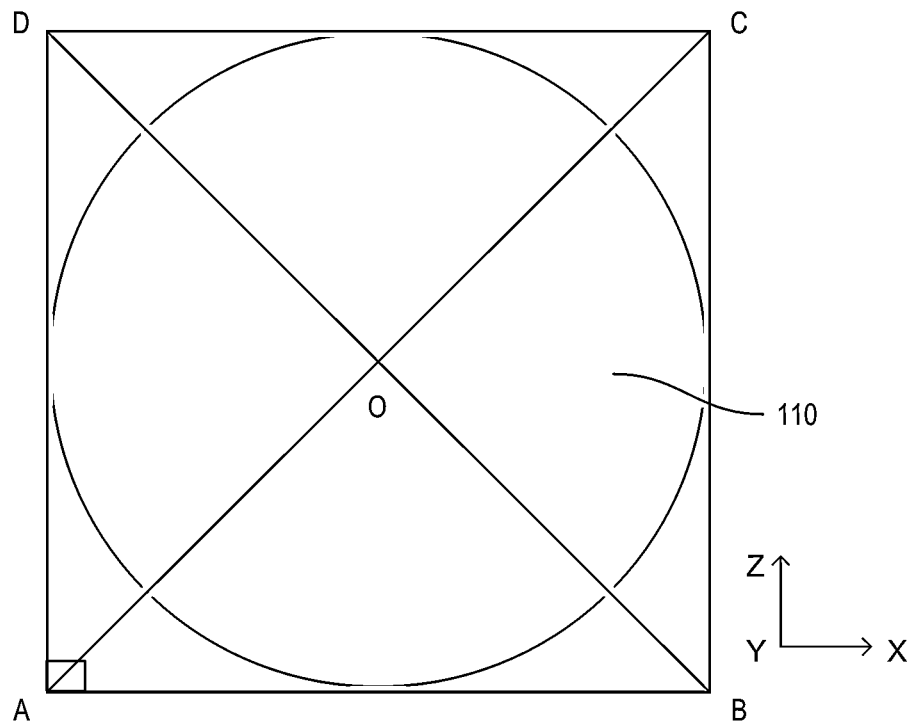
FIG. 1 shows a schematic of transmission electron microscope (TEM) imaging without elliptical distortion.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In order to trust microscopy data, one needs to ensure accurate data measurements. The microscope should be well aligned, and aberrations should be understood and corrected. Distortion is a kind of aberration which distorts an object being imaged. In the presence of distortion, rays from each point of the object reunite at corresponding points in an image plane, but the magnification varies throughout the image plane. For example, elliptical distortion is a common distortion in transmission electron microscopes (TEM). When elliptical distortion occurs, the magnification is different in different radial directions, which might be noted as "TEM has elliptical distortion" or "a TEM image has elliptical distortion".

Elliptical distortion can arise for a few reasons. One common reason is astigmatism. That is, when symmetry of a lens system of the TEM is broken, electrons may be focused to varied degrees in different radial directions. Elliptical distortion can also occur due to a problematic camera (or detector). For example, misplacement of the detector or non-uniform pixel pitches can cause elliptical distortion even when the lens system is perfectly aligned.

Elliptical distortion is often detected by examining a diffraction pattern of a sample in the case of astigmatism. In the absence of elliptical distortion, the diffraction pattern is circular. In the presence of elliptical distortion, the diffraction pattern is elliptical with a major axis and a minor axis that are perpendicular to each other. Magnification is different along the two axes, and elliptical distortion is often analyzed along the two axes. Similarly, for a problematic camera, the image of a circular object will appear elliptical.

Figure 2:
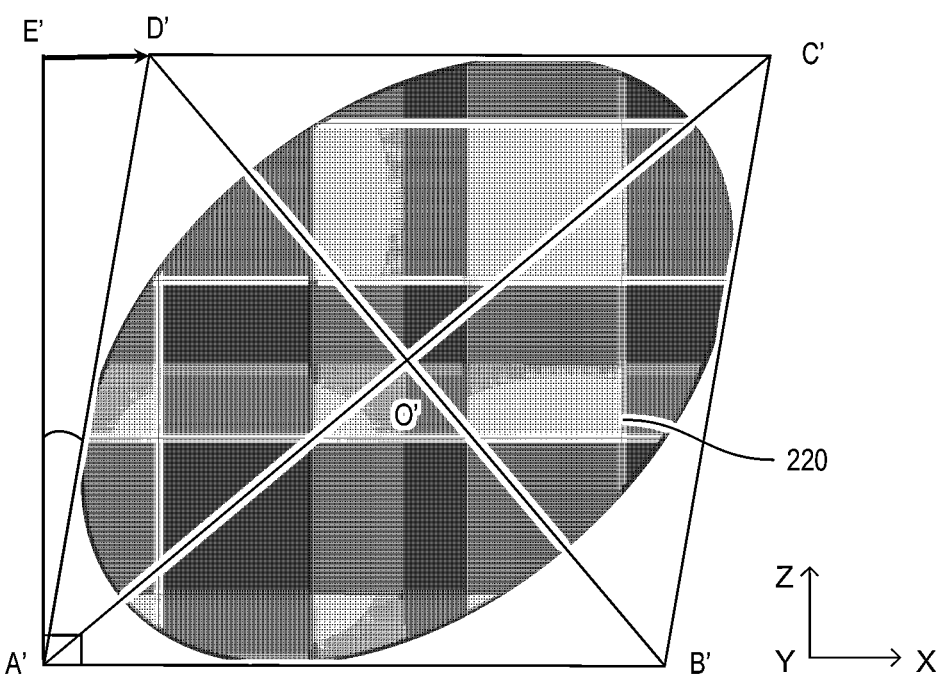
FIG. 2 shows a schematic of TEM imaging with elliptical distortion.

FIG. 1 shows a schematic of transmission electron microscope (TEM) imaging without elliptical distortion, and FIG. 2 shows a schematic of TEM imaging with elliptical distortion. In one example, FIG. 2 shows a diffraction pattern of a sample when astigmatism occurs. In another example, FIG. 2 shows an image on a problematic camera.

In FIG. 1, Line AC and Line BD represent two perpendicular axes of a circle 110. Point O is an intersection point of Line AC and Line BD and is also a center of the circle 110. Line AC and Line BD are equally long, meaning no distortion. Thus, Line AD and Line AB are perpendicular to each other. An object having a shape of Square ABCD can have an undistorted TEM image having a shape of Square ABCD because there is no distortion.

In FIG. 2, Line A'C' and Line B'D' can represent a major axis and a minor axis of an ellipse 220 respectively. Line A'C' and Line B'D' are perpendicular to each other and intersect at Point O'. In a non-limiting example, Line A'C' is not distorted while Line B'D' has a 1% distortion (e.g. a 1% reduction in length), resulting in elliptical distortion. As a result, Line A'D' and Line A'B' are no longer perpendicular to each other. Herein, Line A'B' extends in the x direction, and Line A'E' extends in the z direction.

$$\angle D'A'O' = \arctan\frac{D'O'}{A'O'} = \arctan 0.99 = 44.712°.$$

$$\angle B'A'O' = \arctan\frac{B'O'}{A'O'} = \arctan 0.99 = 44.712°.$$

Therefore, ∠D'A'E'=90°−∠D'A'O'−∠B'A'O'=0.576°. Line A'D' is tilted compared with Line A'E' which is perpendicular to line A'B'.

In one example, the object having the shape of Square ABCD is placed such that Line AB extends along the x direction and Line AD extends along the z direction. Consequently, the object can have a first distorted TEM image having a shape of Diamond A'B'C'D' due to the elliptical distortion. Herein, Points A', B' C' and D' correspond to Points A, B, C and D respectively. $\overrightarrow{E'D'}$ can represent a tilting shift of Line A'D' caused by distortion (thus also referred to as a distortion-induced shift). That is, $\overrightarrow{E'D'}$ represents an orthogonal projection of Line A'D' along Line A'B'. $|\overrightarrow{E'D'}|$ is a length of the orthogonal projection or a scalar value of $\overrightarrow{E'D'}$. Assuming A'C'=AC and B'D'=0.99 BD, therefore A'D'≈AD. More importantly, $|\overrightarrow{E'D'}|$= $\overrightarrow{A'D'}\times\sin\angle D'A'E'=A'D'\times \sin 0.576°=A'D'\times0.01\approx AD\times0.01$. Hence, the distortion-induced shift of Line AD is about 1% in the +x direction.

In another example, the object having the shape of Square ABCD is placed such that Line AB extends along a first direction of Line A'C' and Line AD extends along a second direction of Line B'D' (not shown). Because Line A'C' is not distorted while Line B'D' has a 1% reduction in length, the object can have a second distorted TEM image having a shape of a rectangle. The rectangle has two undistorted sides that correspond to Line AB and Line DC and extend along the first direction. The rectangle also has two distorted sides that correspond to Line AD and Line BC and extend along the second direction. The two distorted sides each have a 1% reduction in length. Note that the second distorted TEM image has no distortion-induced shift because adjacent sides of the rectangle are perpendicular to each other. Moreover, the object having the shape of Square ABCD can have various distorted TEM images, depending on how the object is placed relative to the major axis (e.g. Line A'C') and the minor axis (e.g. Line B'D') of the ellipse 220. Effect of placement orientation of the object will be explained in greater detail in FIGS. 3A-3D.

Still referring to FIG. 2, the TEM may have any kind of elliptical distortion. In one example, Line A'C' is not distorted while Line B'D' has a 2% distortion (e.g. a 2% reduction in length or a 2% elongation). In another example, Line A'C' and Line B'D' are independently distorted. In addition, other microscopes, such as scanning electron microscopes (SEM), may also have similar image distortion where an image is magnified to varying extents in different axial directions. While the similar image distortion may or may not be called elliptical distortion for a particular microscopy technology, the analysis herein and the techniques disclosed in the present disclosure are nevertheless applicable. For illustration purposes, TEM is used herein as an example.

Figure 3A:
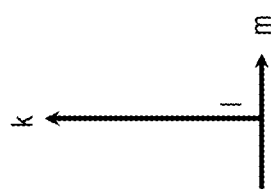
FIG. 3A shows a right angle.
Figure 3B:
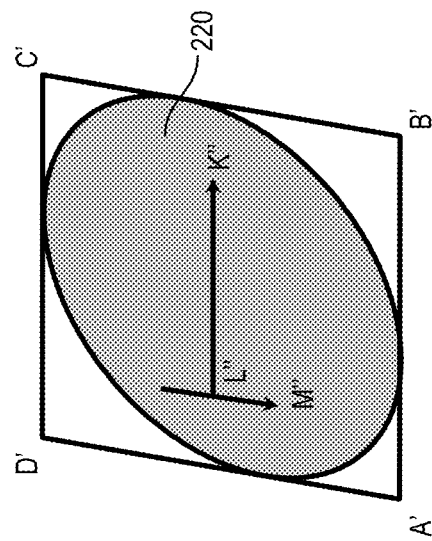
FIGS. 3B, 3C and 3D show elliptical distortion of the right angle in FIG. 3A when the right angle is oriented differently.
Figure 3C:
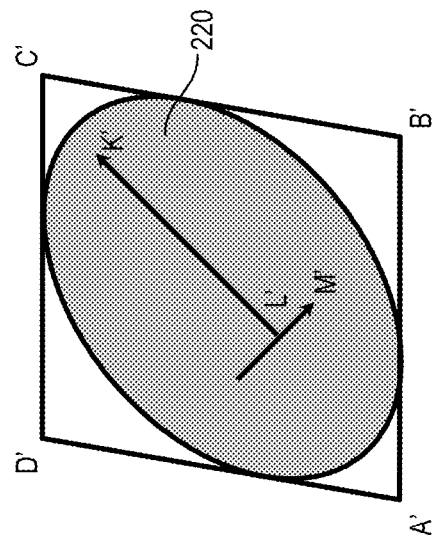
Figure 3D:
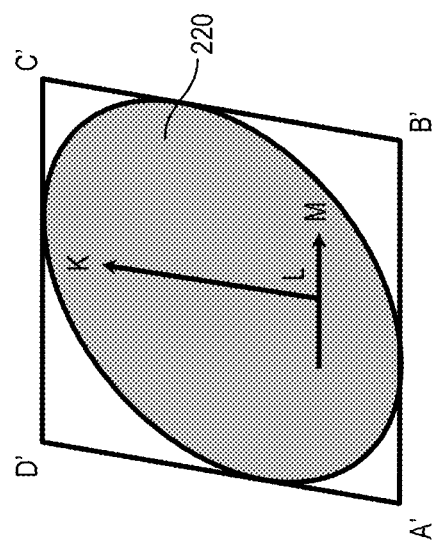

FIGS. 3A-3D are used herein to illustrate how elliptical distortion can distort an angle. For example, a right angle may be distorted to be an acute angle, a right angle or an obtuse angle. FIG. 3A shows a right angle ∠klm, defined by vectors $\overrightarrow{lm}$ and $\overrightarrow{lk}$. FIGS. 3B, 3C and 3D show elliptical distortion of the right angle ∠klm when the right angle ∠klm is oriented differently relative to the ellipse 220.

In FIG. 3B, ∠klm is placed such that $\overrightarrow{lm}$ extends in the +x direction and $\overrightarrow{lk}$ extends in the +z direction. As a result, ∠klm can have a first distorted TEM image, ∠KLM, where K, L, and M correspond to k, l and m respectively. LK is tilted and has a distortion-induced shift along the +x direction, similar to Line A'D' in FIG. 2. ∠KLM is thus an acute angle in the FIG. 3B example. In some examples, the degree of ∠KLM can be dictated by a combination of a first distortion value along the first direction of Line A'C' and a second distortion value along the second direction of Line D'B'.

In FIG. 3C, ∠klm is placed such that $\overrightarrow{lk}$ extends in the first direction of Line A'C' and $\overrightarrow{lm}$ extends in the second direction of Line D'B'. As a result, ∠klm can have a second distorted TEM image, ∠K'L'M', where K', L', and M' correspond to k, l and m respectively. Herein, ∠K'L'M' is still a right angle. Note that while the second distorted TEM image has no change in angle, an object having the angle of ∠klm may have size reduction or expansion that corresponds to distortion values along the main axis and the minor axis of the ellipse 220. Additionally, while not shown, ∠klm can have another distorted TEM image showing a right angle when ∠klm is placed such that $\overrightarrow{lm}$ extends in the first direction of Line A'C' and $\overrightarrow{lk}$ extends in the second direction of Line D'B'.

In FIG. 3D, ∠klm is placed such that $\overrightarrow{lm}$ extends in the −z direction and $\overrightarrow{lk}$ extends in the +x direction. As a result, ∠klm can have a third distorted TEM image, ∠K"L"M", where K", L", and M" correspond to k, l and m respectively. L"M" is tilted, and ∠K"L"M" is an obtuse angle in the example of FIG. 3D. In some examples, the degree of ∠K"L"M" is dictated by the first distortion value along the first direction of Line A'C' and the second distortion value along the second direction of Line D'B'.

In addition to the examples of FIGS. 3B, 3C and 3D, the right angle ∠klm can have other distorted TEM images depending on how the right angle ∠klm is placed and oriented relative to the ellipse 220. Hence, with elliptical distortion, a measured angle by TEM can be larger than, as large as or smaller than an actual angle. In some examples, the measured angle by TEM can be an angle between a contact structure and a working surface of a substrate in a vertical NAND memory device. This is the root cause of unstable measuring results and unexpectedly large tilting results in related examples. This unpredictability and instability renders TEM measurements unreliable if elliptical distortion is uncorrected.

Particularly, for microelectronic applications such as the aforementioned vertical NAND flash memory technology, elliptical distortion in TEM can cause measurement errors. Measurement errors caused by elliptical distortion can be larger than a dimension of interest in some semiconductor devices, such as a vertical NAND memory device and the like. Hence, elliptical distortion in TEM may need to be corrected to ensure data accuracy. It is noted that a vertical NAND memory device is used as an example to illustrate correction techniques of elliptical distortion, and that the correction techniques of elliptical distortion can be used during fabrication of other semiconductor devices.

In some examples, a vertical NAND memory device includes vertical structures, such as channel structures, dummy channel structures, contact structures and the like. Tilting of the vertical structures may cause operation failure in the vertical NAND memory device. For illustration purposes, a contact structure is used as an example in the following description.

Figure 4A:
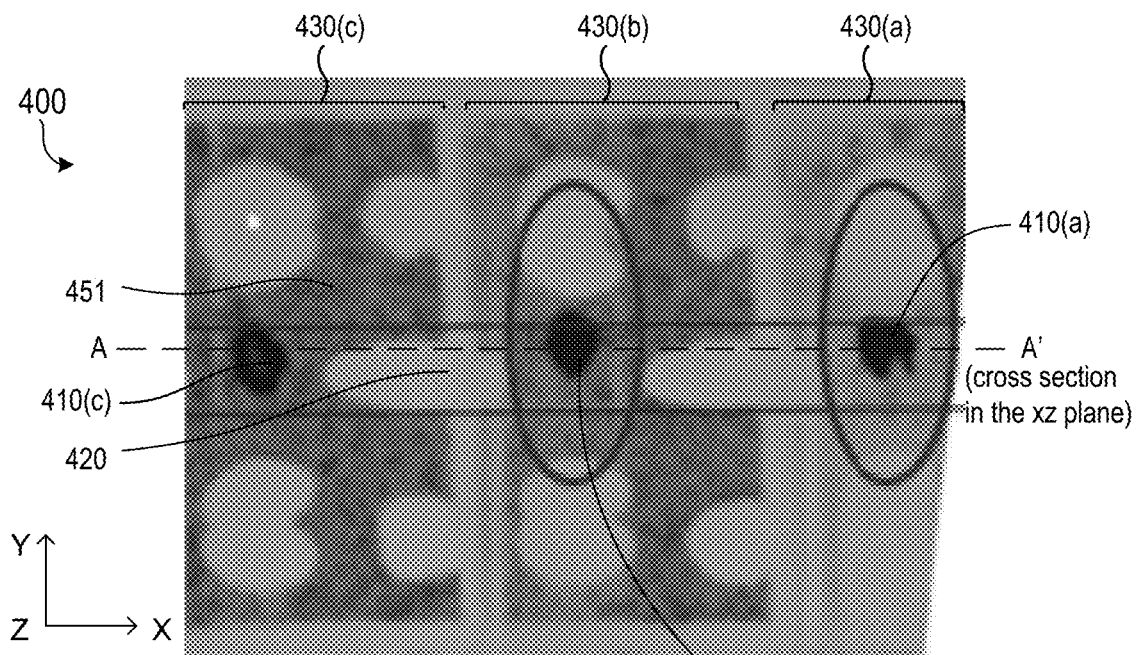
FIG. 4A shows a top view of a semiconductor device.
Figure 4B:
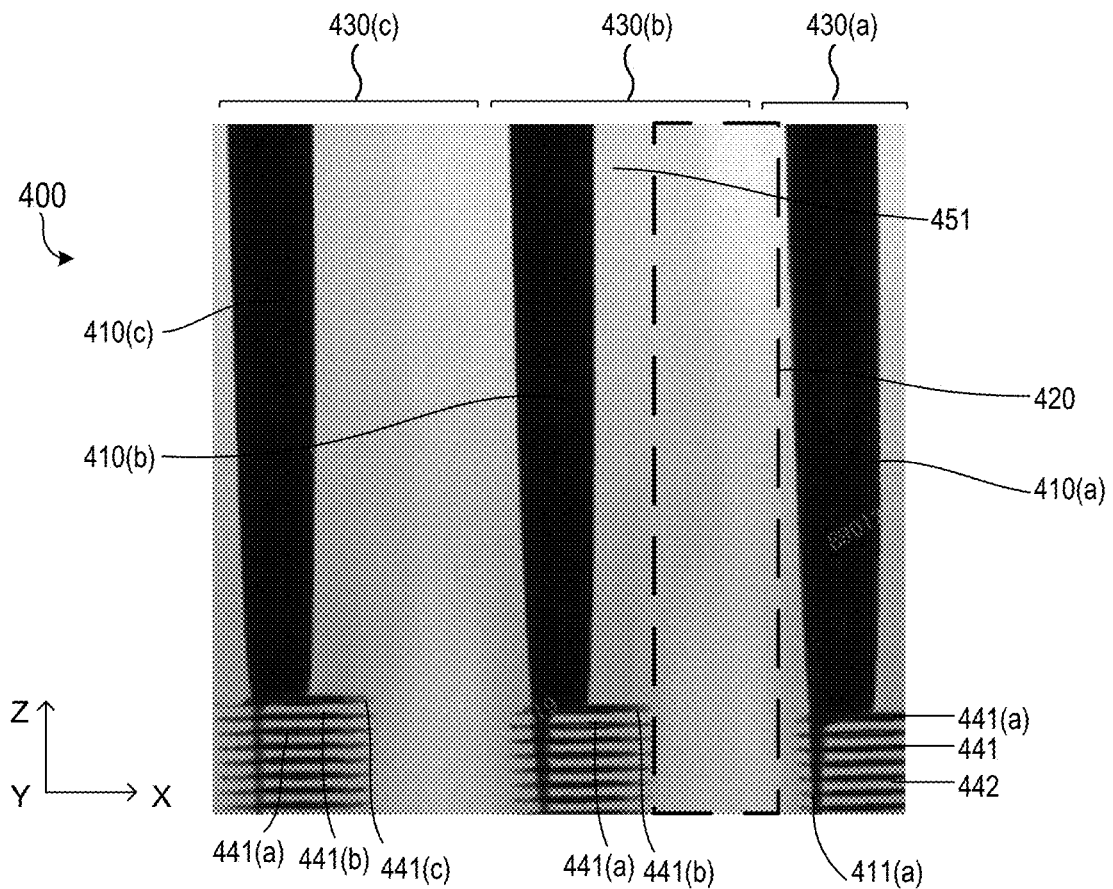
FIG. 4B shows a vertical cross-sectional view taken along the line cut AA' in FIG. 4A.

FIG. 4A shows a top view of a semiconductor device 400. FIG. 4B shows a vertical cross-sectional view of the semiconductor device 400 taken along the line cut AA' in FIG. 4A. Both FIG. 4A and FIG. 4B were obtained by TEM characterization. In the FIGS. 4A and 4B examples, the semiconductor device 400 includes a vertical NAND memory device. Specifically, the semiconductor device 400 can include a stack of alternating insulating layers and gate layers. The stack includes a core region and a staircase region. The core region can include a plurality of channel structures while the staircase region can include a plurality of steps and contact structures. The staircase region may be covered by an insulating layer.

As shown, the semiconductor device 400 can include a staircase region that includes a plurality of steps 430, such as shown by 430(a), 430(b) and 430(c). Contact structures 410 are formed on the steps 430 to make connections to gates of transistors connected in series vertically. For example, a contact structure 410(a) is formed on the step 430(a) and is conductively connected with a gate layer 441(a); a contact structure 410(b) is formed on the step 430(b) and is conductively connected with a gate layer 441(b); and a contact structure 410(c) is formed on the step 430(c) and is conductively connected with a gate layer 441(c). Generally, gate layers 441, such as the gate layers 441(a), 441(b) and 441(c) and the like are stacked with insulating layers 442 between the gate layers 441, so the gate layers 441 can be separately controlled.

The semiconductor device 400 also includes a plurality of dummy channels 420. The plurality of dummy channels 420 can provide physical and mechanical support to the semiconductor device 400 when sacrificial layers (not shown) are removed to form the gate layers 441 during device fabrication. In other words, the plurality of dummy channels 420 can prevent the semiconductor device 400 from collapsing.

Referring to FIG. 4A, the contact structures 410 and the dummy channels 420 are spaced apart from one another and separated by an insulating material 451, such as silicon oxide. However, as the number of transistors connected in series vertically continues to increase for a vertical NAND memory device, vertical structures are becoming longer and longer in the z direction. Such vertical structures can include the contact structures 410, the dummy channels 420, channels (not shown), gate line slits (not shown), etc. A tilting of a vertical structure can cause the vertical structure to merge with another structure that is supposed to be separate from the vertical structure, and cause malfunction.

For example in FIG. 4B, the contact structure 410(a) tilts toward and merges with a dummy channel 420. Specifically, during an etch operation for forming the contact structure 410(a), the tiling may cause an etching penetration to layers under the gate layer 441(a). As a result, the contact structure 410(a) forms a tail 411(a) extending through layers under the gate layer 441(a), such as some other gate layers 441 and insulating layers 442. The tail 411(a) can cause shorting gate layers and tier-to-tier leakage. Note that in the example of FIG. 4B, the insulating material 451 and the dummy channels 420 both include silicon oxide. While the dummy channel 420 is illustrated as a dotted rectangle, it should be understood that the dummy channel 420 is formed around the area represented by the dotted rectangle and may not have a strict rectangular shape.

Tilting of such vertical structures can reduce device yield significantly and may need to be monitored closely. In some examples, when vertical structures, such as the contact structures 410, are more than 10 μm long in the z direction, tilting characterization of the vertical structures cannot be accomplished by certain in-line characterization. Instead, in some examples, tilting characterization can be achieved by imaging a cross section of a product including the vertical structure by TEM.

As discussed in FIGS. 1, 2 and 3A-3D, elliptical distortion can distort a TEM image by tilting a structure and/or changing a size of the structure. A TEM can have a 1% distortion in an axial direction for various reasons even when the TEM has been repeatedly adjusted. The 1% distortion can result in a 0.576° tilting as demonstrated in FIG. 2. This 0.576° tilting can then lead to a 1% distortion-induced shift (e.g. $\overrightarrow{E'D'}$ in FIG. 2). For a contact structure (e.g. 410) which is about 10 μm long, the distortion-induced shift along a silicon substrate can be as large as 10 μm×1%=100 nm. Note that a tilting shift measured by TEM characterization results from both the distortion-induced shift and an actual tilting shift of the contact structure.

However, the actual tilting shift of the contact structure is usually less than 100 nm, which is smaller than the distortion-induced shift. Consequently, the distortion-induced shift may need to be decoupled to obtain the actual tilting shift (also referred to as a corrected tilting shift).

According to some aspects, the present disclosure provides a method of tilting characterization by a microscope. Specifically, a first tilting shift of structures, which are formed in a vertical direction on a horizontal plane of a product, is measured by the microscope based on a first disposition of the structures. A second tilting shift of the structures is then measured by the microscope based on a second disposition of the structures. The second disposition is a horizontal flip of the first disposition, meaning that the second disposition can be obtained by rotating the first disposition around a vertical axis (e.g. the z axis) by 180°. Subsequently, a corrected tilting shift is determined based on the first tilting shift and the second tilting shift.

"Product" as used herein generically refers to any manufactured product or a processed sample. The product may be intermediate or final. The product may include a semiconductor device, a medical device, a nanomaterial, and the like. Structures of the product can be characterized using techniques herein. In some examples, the structures can include channel structures, dummy channel structures, contact structures and the like. For illustration purposes, a contact structure is used as an example in the following description.

Techniques herein decouple the distortion-induced shift from the tilting shift measured by a TEM to obtain an actual tilting shift (also referred to as a corrected tilting shift). The decoupling can be accomplished by simple scalar or vector calculation, such as addition and subtraction. Even when the distortion-induced shift is larger than the actual tilting shift, the decoupling is reliable and the corrected tilting shift is accurate. Moreover, the present disclosure provides techniques to characterize the distortion-induced shift caused by elliptical distortion. Thus, the distortion-induced shift or the elliptical distortion can be monitored over time for a plurality of samples to evaluate status of a microscope.

Techniques herein enable accurate data measurement in the presence of elliptical distortion. A TEM, especially an old TEM, may have a persistent elliptical distortion that is economically prohibitive to fix. For example, replacing a defective camera or lens system may be too expensive. Techniques herein solve this problem even if the persistent elliptical distortion manifests itself in every measurement.

In some embodiments, two corrected tilting shifts along two perpendicular directions in the horizontal plane are determined. Then, a tilting-induced shift of the structures in the horizontal plane is obtained based on a combination of the two corrected tilting shifts. The tilting-induced shift of the structures in the horizontal plane represents an orthogonal projection of the structures on the horizontal plane.

In some embodiments, the structures can include word line contacts (e.g. the contact structures 410 in FIG. 4B) or dummy channels (e.g. the dummy channels 420 in FIG. 4B) of a vertical NAND memory device, or other vertical structures in a semiconductor device. The present disclosure provides a method for characterizing tilting of the word line contacts by a TEM with elliptical distortion.

Figure 5A:
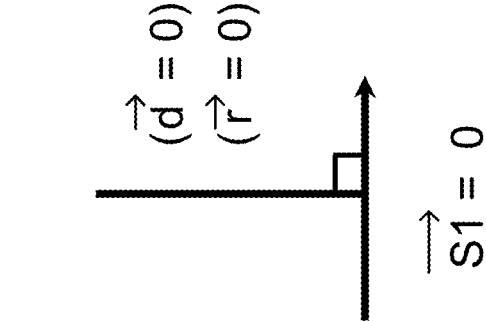
FIGS. 5A, 5B, 5C, 5D, 5E, 5F, 5G and 5H show schematics that analyze coupling and decoupling of elliptical distortion and structure tilting, in accordance with embodiments of the disclosure.
Figure 5B:
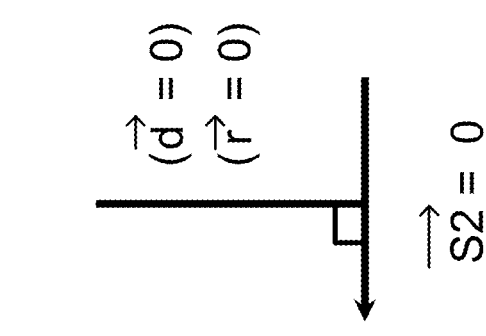
Figure 5C:
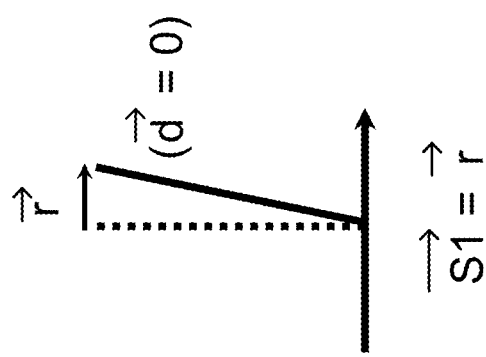
Figure 5D:
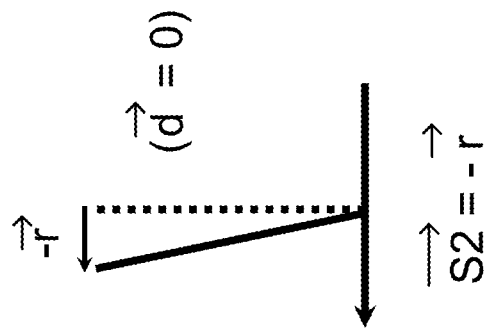
Figure 5E:
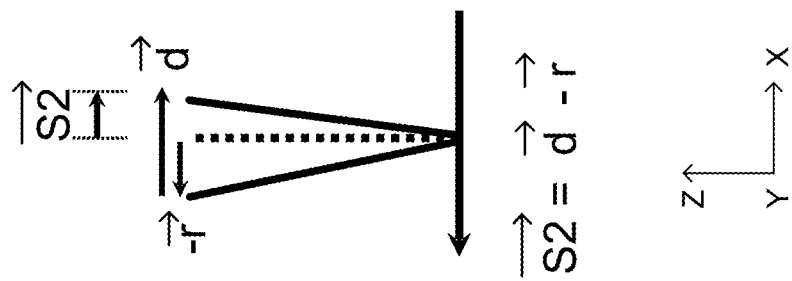
Figure 5F:
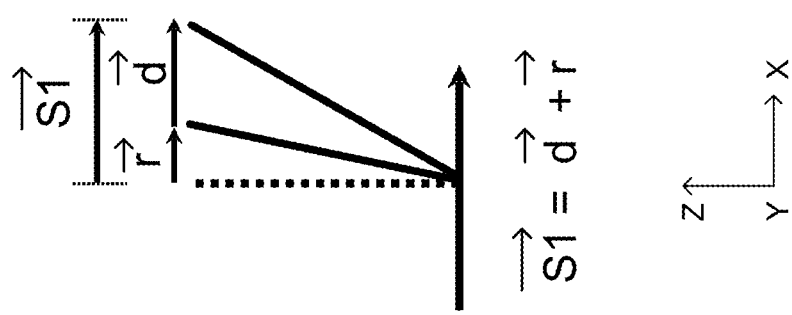
Figure 5G:
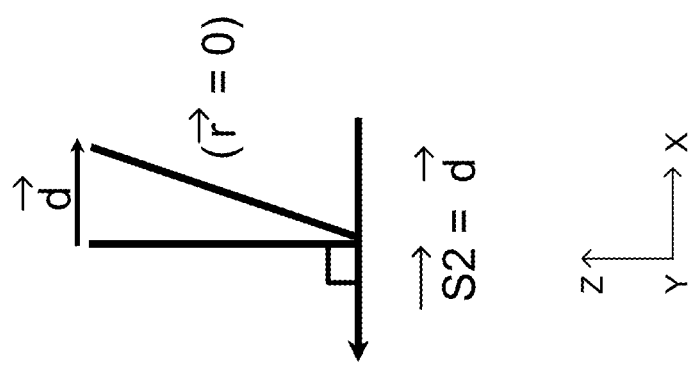
Figure 5H:
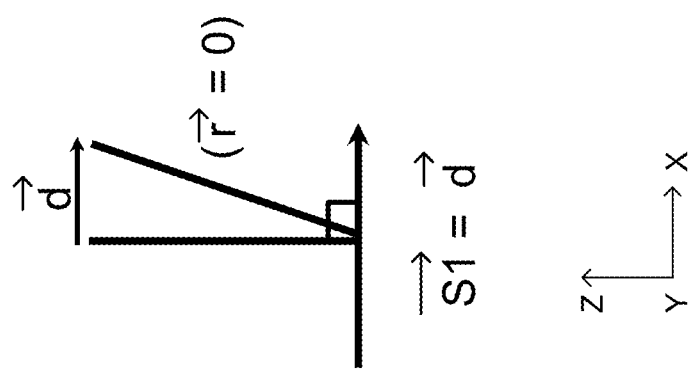

FIGS. 5A, 5B, 5C, 5D, 5E, 5F, 5G and 5H show schematics that analyze coupling and decoupling of elliptical distortion and structure tilting, in accordance with Angembodiments of the disclosure. Particularly, FIG. 5A is based on a first disposition of structures, and FIG. 5B is based on a second disposition of the structures. The second disposition is a horizontal flip of the first disposition. Thus, FIG. 5A is considered an unflipped image while FIG. 5B is considered a flipped image of FIG. 5A. Similarly, FIGS. 5D, 5F and 5H are considered flipped images of FIGS. 5C, 5E and 5G respectively. Note that coordinate axes x, y and z describe a relative orientation of an object in a microscope, and are associated with the microscope. Thus, the coordinate axes x, y and z are not changed in flipped images, FIGS. 5B, 5D, 5F and 5H, when the microscope is unchanged. For example, the coordinate axes x, y and z can be coordinate axes of an image plane in a TEM. Flipping an object may result in a flipped image, but the coordinate axes of the image plane in the TEM will remain unchanged.

Herein, a distortion-induced shift is noted as $\vec{d}$, and an actual tilting shift (also referred to as a corrected tilting shift) is noted as $\vec{r}$. Tilting shifts measured by TEM based on an unflipped image and a flipped image are noted as $\vec{S1}$ and $\vec{S2}$ respectively. It will be shown that $$\vec{S1} = \vec{d} + \vec{r}, \vec{S2} = \vec{d} - \vec{r}, \vec{d} = \frac{\vec{S1} + \vec{S2}}{2}, \text{ and } \vec{r} = \frac{\vec{S1} - \vec{S2}}{2}.$$

In the examples of FIGS. 5A and 5B, $\vec{d}=0$ and $\vec{r}=0$. There is no elliptical distortion or actual tilting of the structures. As a result, $\vec{S1}=0$, and $\vec{S2}=0$. In other words, $\vec{S1}=0=\vec{d}+\vec{r}$, and $\vec{S2}=0=\vec{d}-\vec{r}$. Therefore, $$\vec{d} = \frac{\vec{S1} + \vec{S2}}{2}, \text{ and } \vec{r} = \frac{\vec{S1} - \vec{S2}}{2}.$$

In the examples of FIGS. 5C and 5D, $\vec{d}=0$ and $\vec{r}\neq 0$. There is no elliptical distortion, but the structures are tilted. As a result, $\vec{S1}=\vec{r}$, and $\vec{S2}=-\vec{r}$, meaning that the tilting shifts measured by TEM are actual tilting shifts not affected by any elliptical distortion. Under this circumstance, $\vec{S1}=\vec{r}=\vec{d}+\vec{r}$, and $\vec{S2}=-\vec{r}=\vec{d}-\vec{r}$. Therefore, $$\vec{d} = \frac{\vec{S1} + \vec{S2}}{2}, \text{ and } \vec{r} = \frac{\vec{S1} - \vec{S2}}{2}.$$

In the examples of FIGS. 5E and 5F, $\vec{d}\neq 0$ and $\vec{r}=0$. The structures are not tilted but there is elliptical distortion. As a result, $\vec{S1}=d$, and $\vec{S2}=d$, meaning that the tilting shifts measured by TEM are purely distortion-induced shifts. Similarly, in this case, $\vec{S1}=\vec{d}=\vec{d}$ and $\vec{S2}=\vec{d}=\vec{d}-\vec{r}$. Therefore, $$\vec{d} = \frac{\vec{S1} + \vec{S2}}{2}, \text{ and } \vec{r} = \frac{\vec{S1} - \vec{S2}}{2}.$$

In the examples of FIGS. 5G and 5H, $\vec{d}\neq 0$ and $\vec{r}\neq 0$. There is elliptical distortion, and the structures are tilted. As a result, $\vec{S1}=\vec{d}+\vec{r}$, and $\vec{S2}=\vec{d}-\vec{r}$. Moreover, $$\vec{d} = \frac{\vec{S1} + \vec{S2}}{2}, \text{ and } \vec{r} = \frac{\vec{S1} - \vec{S2}}{2}.$$

Referring to FIGS. 5A-5H, $$\vec{S1} = \vec{d} + \vec{r},$$
$$\vec{S2} = \vec{d} - \vec{r},$$
$$\vec{d} = \frac{\vec{S1} + \vec{S2}}{2},$$
$$\text{and } \vec{r} = \frac{\vec{S1} - \vec{S2}}{2}$$

are valid under various circumstances.

According to an aspect of the disclosure, scalar operation instead of the above vector operation can also be used to determine the corrected tilting. In the cases where $\vec{d}$ and $\vec{r}$ are in the same direction, $|\vec{S1}|=|\vec{d}|+|\vec{r}|$, and $|\vec{S2}|=||\vec{d}|-|\vec{r}||$. A direction of $\vec{S2}$ is dictated by relative values of $|\vec{d}|$ and $|\vec{r}|$. Particularly, in the examples of FIGS. 5A-5H, $\vec{d}$ and $\vec{r}$ both extend in the +x direction. When $|\vec{d}|>|\vec{r}|$, $\vec{S2}$ extends in the +x direction. When $|\vec{d}|<|\vec{r}|$, $\vec{S2}$ extends in the −x direction. When $|\vec{d}|=|\vec{r}|$, $\vec{S2}=0$. It is noted that in the cases where $|\vec{d}|$ and $|\vec{r}|$ are in opposite directions, $|\vec{S1}|=||\vec{d}|-|\vec{r}||$, and $|\vec{S2}|=|\vec{d}|+|\vec{r}|$. Further, all the vector analyses herein using $\vec{d}$ and $\vec{r}$ can be replaced with scalar analyses using $|\vec{d}|$ and $|\vec{r}|$. A major difference is that directions of the distortion-induced tilting and the actual tilting may need to be analyzed separately.

While in the examples of FIGS. 5A-5H, $\vec{d}$ and $\vec{r}$ both extend in the +x direction, at least one of $\vec{d}$ or $\vec{r}$ may extend in the −x direction in other examples. Nevertheless, similar vector or scalar analyses can be applied, and $$\vec{S1} = \vec{d} + \vec{r},$$
$$\vec{S2} = \vec{d} - \vec{r},$$
$$\vec{d} = \frac{\vec{S1} + \vec{S2}}{2},$$
$$\text{and } \vec{r} = \frac{\vec{S1} - \vec{S2}}{2}$$

are still valid. Further, errors introduced by the assumption that $\vec{d}$ and $\vec{r}$ are parallel to the x direction are negligible. In an example, a word line contact (e.g. the contact structure 410) has a length of 13,000 nm, and the errors introduced by the assumption are less than 3 nm when a tilting shift is measured.

Figure 6A:
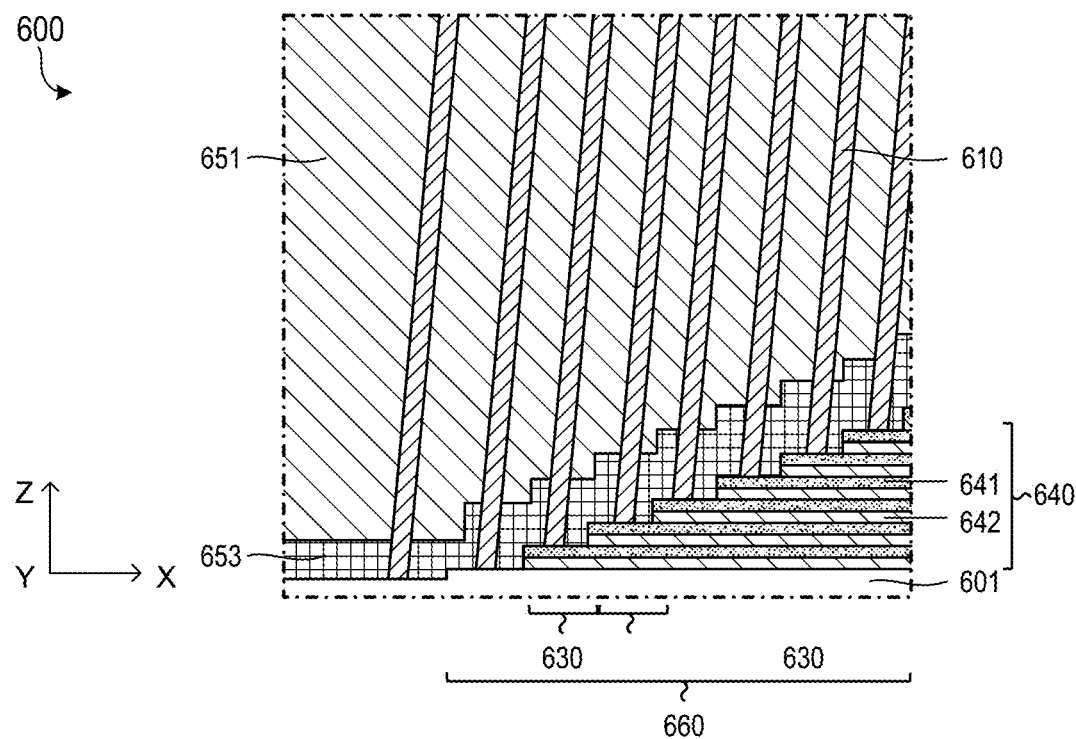
FIG. 6A shows a cross-sectional view of a semiconductor device in the presence of elliptical distortion, in accordance with embodiments of the disclosure.

FIGS. 6A-6F show examples of tilting characterization of structures, such as word line contacts, by a TEM, in accordance with embodiments of the disclosure. In one embodiment, FIG. 6A shows an unflipped cross-sectional view of a semiconductor device 600, in the presence of elliptical distortion. The semiconductor device 600 can include a vertical NAND memory circuit having a core region (not shown) and a staircase region 660 having a plurality of steps 630.

As shown, the semiconductor device 600 includes a stack 640 of alternating gate layers 641 and insulating layers 642. Each step 630 includes one or more pairs of alternating gate layers 641 and insulating layers 642. The semiconductor device 600 further includes a plurality of contact structures 610 in the staircase region 660. Each contact structure 610 is connected to a respective gate layer 641 of a respective step 630.

Note that the embodiment of the semiconductor device 600 is similar to the embodiment of the semiconductor device 400 in FIGS. 4A and 4B. For example, the gate layers 641 in FIG. 6A correspond to the gate layers 441 in FIGS. 4A-4B. The insulating layers 642 in FIG. 6A correspond to the insulating layers 442 in FIGS. 4A-4B. The steps 630 in FIG. 6A correspond to the steps 430 in FIGS. 4A-4B. The contact structures 610 in FIG. 6A correspond to the contact structures 410 in FIGS. 4A-4B. An insulating material 651 in FIG. 6A corresponds to the insulating material 451 in FIGS. 4A-4B. Descriptions have been provided above and will be omitted here for simplicity purposes. The semiconductor device 600 may further include dummy channels (not shown) that correspond to the dummy channels 420.

As illustrated, the contact structures 610 are not extending strictly in the z direction. In other words, the contact structures 610 are tilted. In one example, a first tilting shift, $\vec{S1}$ measured in FIG. 6A includes $|\vec{S1}|=108$ nm in the +x direction. The first tilting shift, $\vec{S1}$ represent an orthogonal projection of the contact structures 610 along the x direction. $\vec{S1}$ can be obtained by measuring a tilting shift of one particular contact structure 610, or $\vec{S1}$ can be an average value or a weighted average value of a plurality of contact structures 610. The first tilting shift, $\vec{S1}$ can be measured in a variety of ways. For example, image analysis software or an image analysis algorithm can be used to obtain $\vec{S1}$. Alternatively, a TEM user may print out FIG. 6A, manually draw the orthogonal projection and measure the orthogonal projection using a ruler or any other length measurement tool.

Figure 6B:
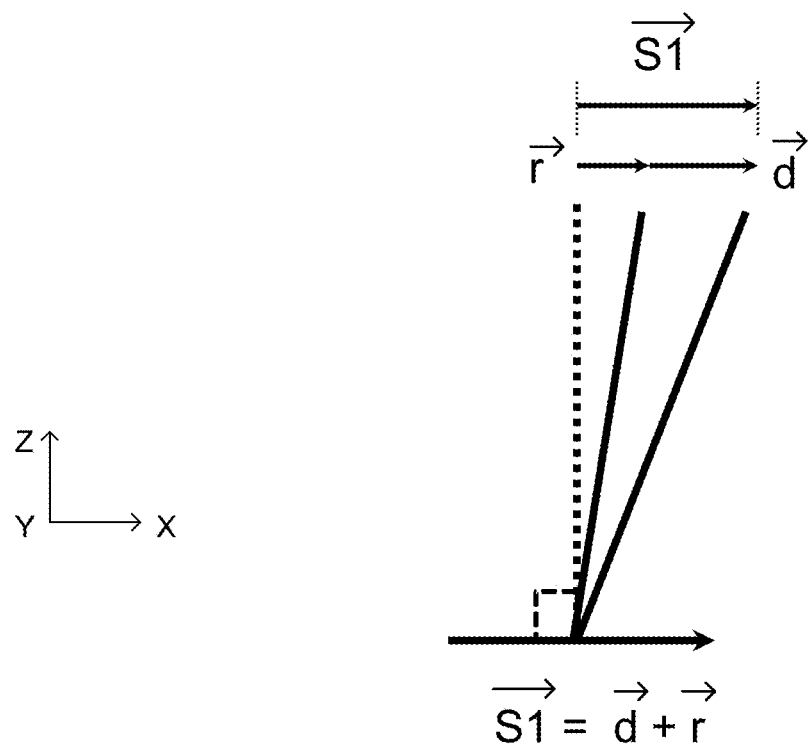
FIG. 6B shows a schematic analyzing elliptical distortion and structure tilting in FIG. 6A, in accordance with embodiments of the disclosure.
Figure 6C:
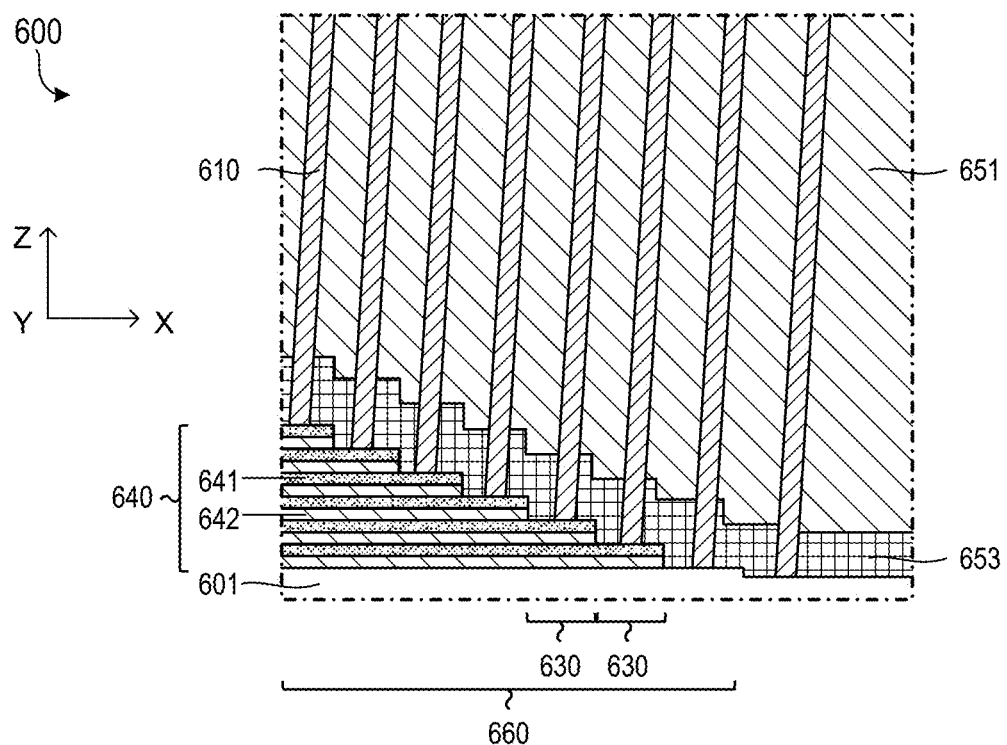
FIG. 6C shows a flipped cross-sectional view of the semiconductor device in FIG. 6A in the presence of the elliptical distortion, in accordance with embodiments of the disclosure.

FIG. 6C shows a flipped cross-sectional view of the semiconductor device 600 in FIG. 6A, in accordance with embodiments of the disclosure. That is, the contact structures 610 in FIG. 6A have a first disposition, and the contact structures 610 in FIG. 6C have a second disposition which is a horizontal flip of the first disposition. In a non-limiting example, coordinate axes x, y and z can be coordinate axes of an image plane in a TEM. Therefore, the coordinate axes x, y and z remain unflipped in FIG. 6C. Without elliptical distortion, FIG. 6C would be a mirror image of FIG. 6A in some examples. As a result, a tilting shift measured by TEM for FIG. 6C would include 108 nm in the −x direction. With elliptical distortion, however, a second tilting shift, $\vec{S2}$ measured in FIG. 6C is not equal to $-\vec{S1}$. In one example, $\vec{S2}$ includes $|\vec{S2}|=8$ nm in the +x direction.

As demonstrated in FIGS. 5A-5H, tilting of the contact structures 610 in a TEM image can result from both elliptical distortion and structure tilting. Very importantly, $$\vec{S1} = \vec{d_x} + \vec{r_x},$$

Figure 6D:
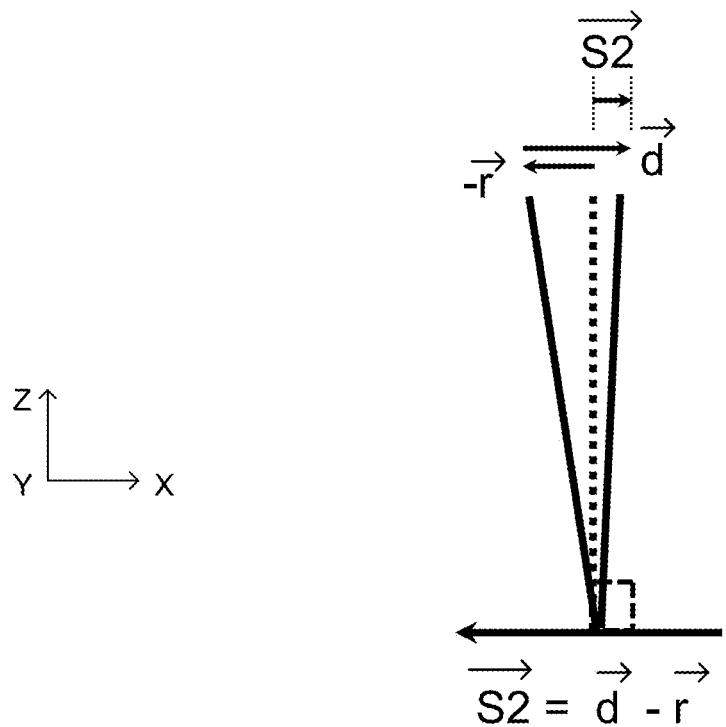
FIG. 6D shows a schematic analyzing elliptical distortion and structure tilting in FIG. 6C, in accordance with embodiments of the disclosure.

-continued $$\vec{S2} = \vec{d_x} - \vec{r_x},$$

$$\vec{d_x} = \frac{\vec{S1} + \vec{S2}}{2},$$

$$\text{and } \vec{r_x} = \frac{\vec{S1} - \vec{S2}}{2},$$

where $\vec{d_x}$ and $\vec{r_x}$ represent the distortion-induced shift along the x direction and the corrected shift along the x direction respectively. Herein, $\vec{S1}$ includes $|\vec{S1}|=108$ nm in the +x direction, and, $\vec{S2}$ includes $|\vec{S2}|=8$ nm in the +x direction. Therefore, $$\vec{d_x} = \frac{\vec{S1} + \vec{S2}}{2}$$

includes $|\vec{d_x}|=56$ nm in the +x direction, and $$\vec{r_x} = \frac{\vec{S1} - \vec{S2}}{2}$$

includes $|\vec{r_x}|=50$ nm in the +x direction. FIGS. 6B and 6D show schematics analyzing elliptical distortion and structure tilting in FIGS. 6A and 6C respectively, in accordance with embodiments of the disclosure.

Figure 6E:
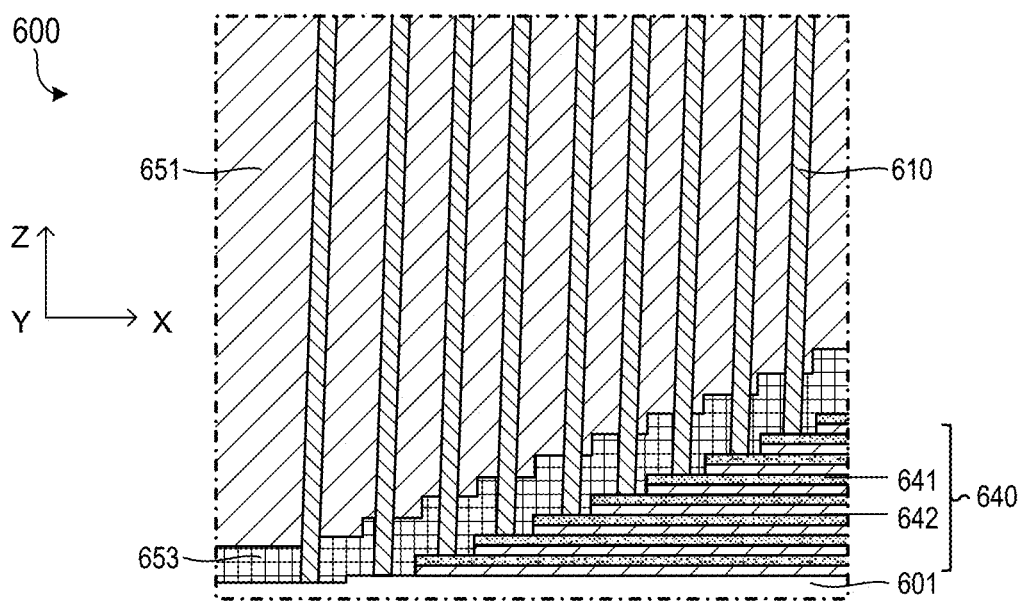
FIG. 6E shows a corrected cross-sectional view of the semiconductor device in FIGS. 6A and 6C when the elliptical distortion has been corrected, in accordance with embodiments of the disclosure.
Figure 6F:
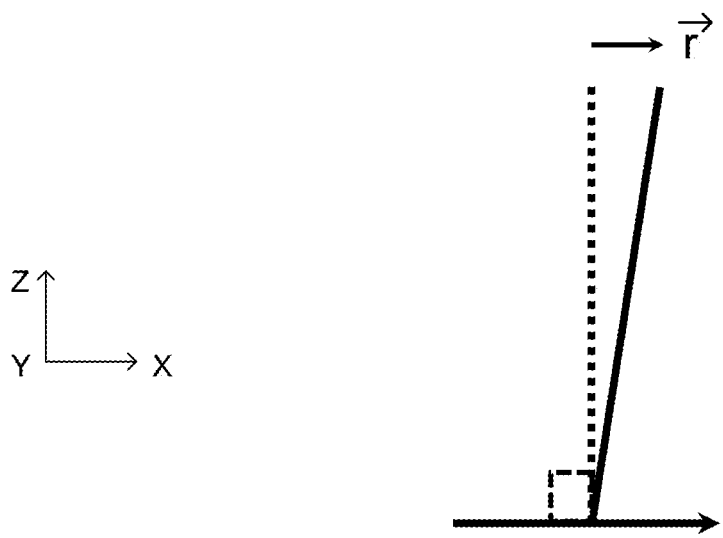
FIG. 6F shows a schematic of corrected structure tilting in FIG. 6E, in accordance with embodiments of the disclosure.

FIG. 6E shows a corrected cross-sectional view of the semiconductor device 600 in FIGS. 6A and 6B when the elliptical distortion has been corrected, in accordance with embodiments of the disclosure. FIG. 6F shows a schematic of corrected structure tilting in FIG. 6E, in accordance with embodiments of the disclosure.

In the examples of FIGS. 6A-6F, tilting characterization of structures, such as word line contacts, by a TEM is illustrated. It should be understood that other structures of a vertical NAND memory circuit, such as dummy channels (e.g. 420), channels, gate line slits, etc., can also be characterized by techniques herein. Additionally, the structures may include other structures of a semiconductor device, structures of a medical device, structures of a nanomaterial and the like.

A horizontal plane is intrinsically two-dimensional. Tilting can often occur in two perpendicular directions of the horizontal plane. In the examples of FIGS. 6A-6F, tilting along the x direction is considered and characterized. Titling along the y direction can be characterized similarly.

In some embodiments, firstly, a third tilting shift, $\vec{S3}$ of the contact structures 610 can be measured by the TEM based on a third disposition of the contact structures 610. The third disposition is substantially perpendicular to the first disposition. In one example, the first disposition (FIG. 6A) corresponds to a cross section in the xz plane, and the third disposition corresponds to a cross section in the yz plane. Secondly, a fourth tilting shift, $\vec{S4}$ of the structures can be measured by the microscope based on a fourth disposition of the structures. The fourth disposition is a horizontal flip of the third disposition. Thirdly, a corrected tilting shift along the y direction is determined based on the third tilting shift, $\vec{S3}$ and the fourth tilting shift, $\vec{S4}$. Similarly, $$\vec{S3} = \vec{d_y} + \vec{r_y},$$

$$\vec{S4} = \vec{d_y} + \vec{r_y},$$

$$\vec{d_y} = \frac{\vec{S3} + \vec{S4}}{2},$$

$$\text{and } \vec{r_y} = \frac{\vec{S3} - \vec{S4}}{2},$$

where $\vec{d_y}$ and $\vec{r_y}$ correspond to the distortion-induced shift along the y direction and the corrected tilting shift along the y direction respectively. Further, a tilting-induced shift of the structures in the horizontal plane noted as $\vec{r_H}$, where $\vec{r_H} = \vec{r_x} + \vec{r_y}$, may be optionally calculated.

$$|\vec{r_H}| = |\vec{r_x} + \vec{r_y}| = \sqrt{|\vec{r_x}|^2 + |\vec{r_y}|^2},$$

and a direction of the tilting-induced shift of the structures in the horizontal plane can be determined using $\vec{r_x}$ and $\vec{r_y}$.

Figure 7:
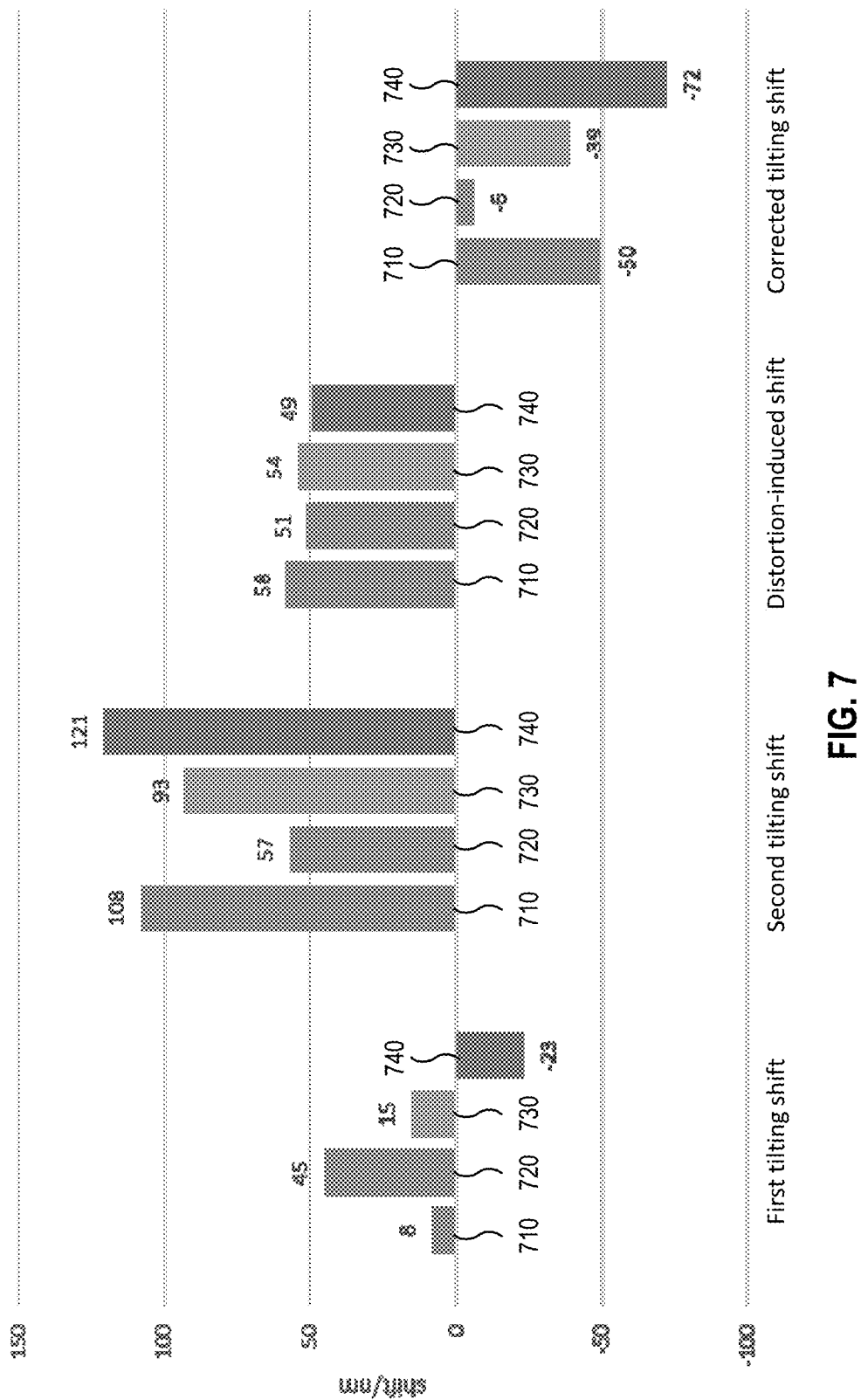
FIG. 7 shows tilting and distortion measurement results for different samples, in accordance with embodiments of the disclosure.

FIG. 7 shows tilting and distortion measurement results for different samples (e.g. 710, 720, 730 and 740), in accordance with embodiments of the disclosure. From left to right, "first tilting shift", "second tilting shift", "distortion-induced shift" and "corrected tilting shift" correspond to $\vec{S1}$, $\vec{S2}$, $\vec{d}$ and $\vec{r}$ respectively in FIGS. 5A-5H. Note that bar charts cannot show directions in a three-dimensional space with coordinate axes. Herein, a positive value corresponds to a shift in the +x direction, and a negative value corresponds to a shift in the −x direction.

For the sample 710, $\vec{S1}$ and $\vec{S2}$ are in the +x direction, with $|\vec{S1}|=8$ nm and $|\vec{S2}|=108$ nm. By applying $$\vec{d_x} = \frac{\vec{S1} + \vec{S2}}{2},$$

$$|\vec{d_x}| = 58 \text{ nm}$$

is in the +x direction. By applying $$\vec{r_x} = \frac{\vec{S1} - \vec{S2}}{2},$$

$$|\vec{r_x}| = 50 \text{ nm}$$

is in the −x direction, which is shown as −50 nm. Similarly, for the sample 720, $\vec{S1}$ and $\vec{S2}$ are in the +x direction, with $|\vec{S1}|=45$ nm and $|\vec{S2}|=57$ nm. Thus, $|\vec{d_x}|=51$ nm is in the +x direction, and $|\vec{r_x}|=6$ nm is in the −x direction, which is shown as −6 nm.

Still referring to FIG. 7, the distortion-induced shifts for the samples 710, 720, 730 and 740 are 58 nm, 51 nm, 54 nm and 49 nm respectively. The corresponding variation is smaller than 10 nm, which is one order of magnitude smaller than the distortion-induced shifts. Such a small variation indicates high accuracy of tilting shift measurement. Moreover, the corrected tilting shifts of a TEM with a 1% elliptical distortion can be as accurate as a TEM with a 0.1% elliptical distortion without correction.

Figure 8:
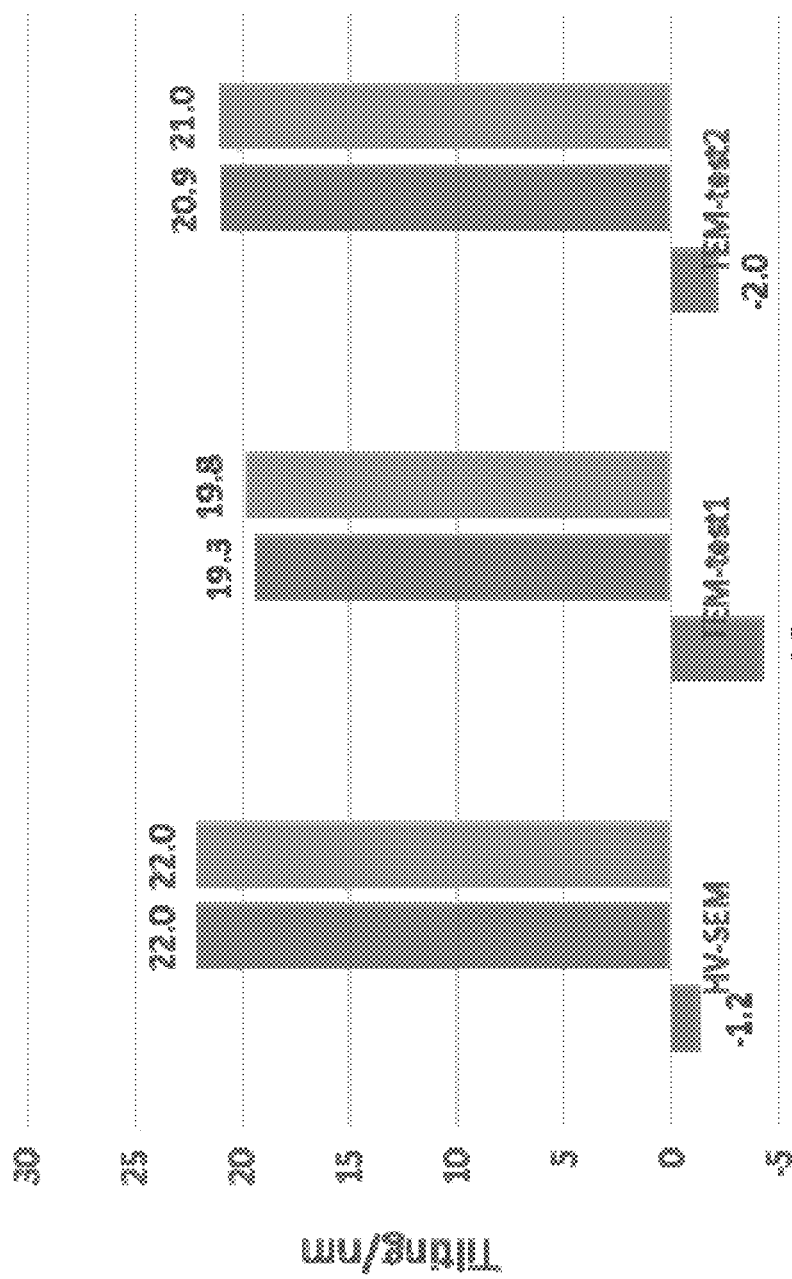
FIG. 8 shows a comparison of tilting measurement results between different characterization techniques, in accordance with embodiments of the disclosure.

FIG. 8 shows a comparison of tilting measurement results between different characterization techniques, in accordance with embodiments of the disclosure. An inline measurement by a scanning electron microscope (SEM) is noted as "HV-SEM". From left to right, three values correspond to $\vec{r}_x$, $\vec{r}_y$ and $\vec{r}_x + \vec{r}_y$ respectively. Specifically, $|\vec{r}_x|=1.2$ nm is in the −x direction. $|\vec{r}_y|=22.0$ nm is in the +y direction. $|\vec{r}_x+\vec{r}_y|=22.0$ nm. Techniques herein were also applied and noted as "TEM-test1" and "TEM-test2". In TEM-Test1, $|\vec{r}_x|=4.2$ nm is in the −x direction. $|\vec{r}_y|=19.3$ nm is in the +y direction. $|\vec{r}_x+\vec{r}_y|=19.8$ nm. In TEM-Test2, $|\vec{r}_x|=2.0$ nm is in the −x direction. $|\vec{r}_y|=20.9$ nm is in the +y direction. $|\vec{r}_x+\vec{r}_y|=21.0$ nm.

The three sets of data were obtained by HV-SEM, TEM-test1 and TEM-test2 for a same product. As can be seen in FIGS. 8, two sets of data obtained by TEM are consistent with each other, and the two sets of data obtained by TEM are very close to a set of data obtained by HV-SEM. The inline SEM measurement can be used as a reference for comparison, and this shows the accuracy of techniques provided in the present disclosure.

Figure 9:
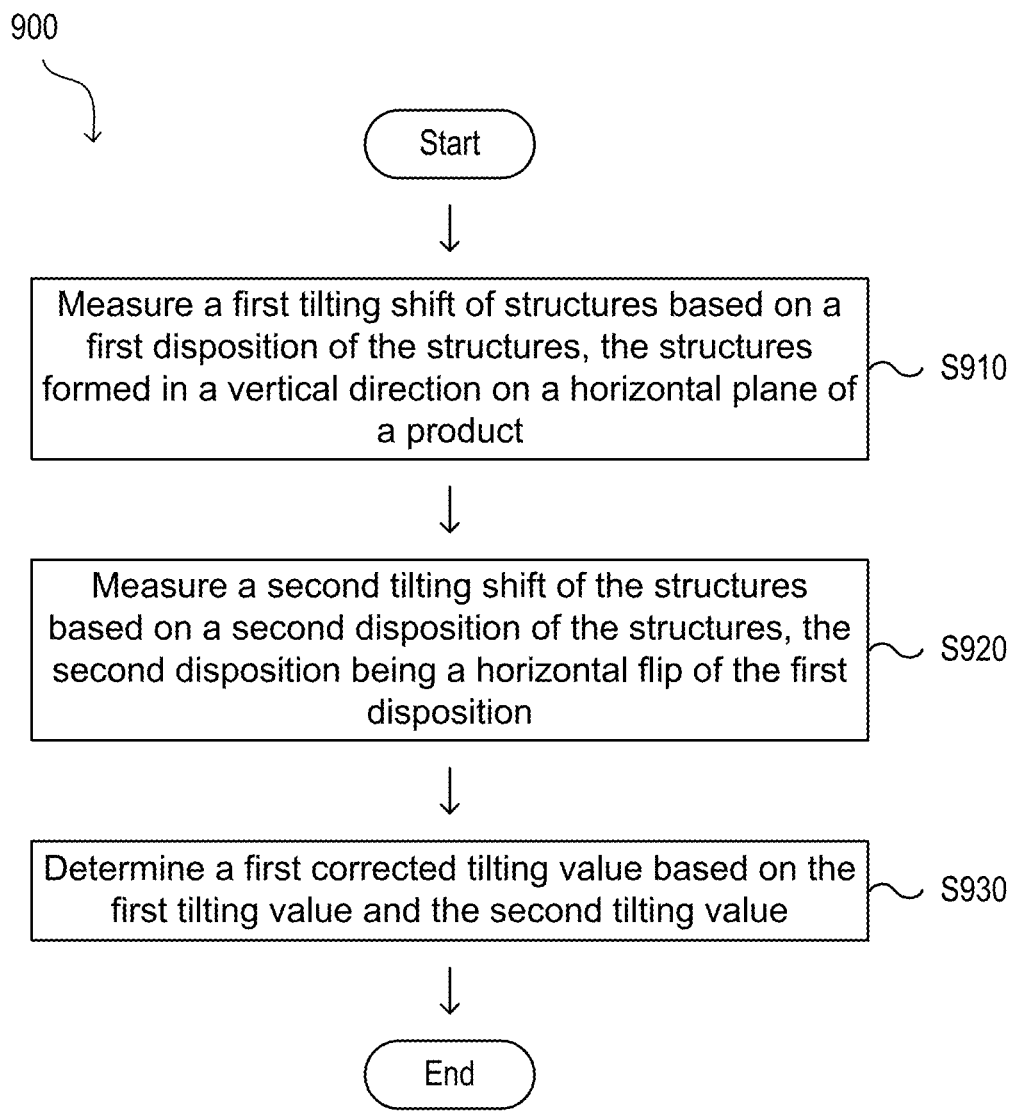
FIG. 9 shows a flow chart of an exemplary process for tilting characterization, in accordance with embodiments of the disclosure.

FIG. 9 shows a flow chart of a process 900 for tilting characterization, in accordance with embodiments of the disclosure. The process 900 begins with Step S910 by measuring a first tilting shift of structures based on a first disposition of the structures. The structures are formed in a vertical direction on a horizontal plane of a product.

In some embodiments, the first tilting shift of the structures is measured by a microscope. In some embodiments, the microscope can include at least one of a transmission electron microscope (TEM), a scanning electron microscope (SEM), an X-ray microscope, an optical microscope, a fluorescence microscope or the like. In some embodiments, the product includes a substrate parallel to the horizontal plane, and the structures are formed in the vertical direction over the substrate. In some embodiments, the structures can include at least one of a word line contact, a channel, a dummy channel or a gate line slit in some examples.

In some embodiments, measuring the first tilting shift of the structures includes capturing a first image of a first cross section of the product by the microscope. The first cross section includes the structures of the first disposition. Image analysis of the first image is then performed to measure the first tilting shift of the structures. In one example, image analysis software or an image analysis algorithm can be used to measure the first tilting shift. In another example, the first image may be printed out so that an orthogonal projection of the structures can be drawn and measured manually.

In a non-limiting example, structures of a vertical NAND memory circuit (e.g. the contact structures 610) are characterized by a TEM. A first cross section of the structures can be obtained by ultramicrotomy, cryo ultramicrotomy, focused ion beam, ion etching, tripod polishing, electrochemical processing or the like. The first cross section can have a thickness of less than 200 nm, e.g. 30-150 nm. Lateral dimensions of the first cross section depend on preparation methods. For instance, a thin slice TEM cross section prepared by ultramicrotomy can have lateral dimensions on the order of a few millimeters, e.g. 3 mm×3 mm. A thin film TEM cross section prepared by focused ion beam can have lateral dimensions below 50 µm, e.g. 15 µm×15 µm. In one example, the vertical NAND memory circuit is disposed on a horizontal substrate that extends in the xy plane, and the first cross section can be a vertical cross section in the xz plane, similar to FIG. 6A.

At Step S920, a second tilting shift of the structures is measured, for example by the microscope, based on a second disposition of the structures. The second disposition is a horizontal flip of the first disposition.

In some embodiments, measuring the second tilting shift of the structures includes flipping the first cross section to obtain a flipped first cross section that includes the structures of the second disposition. Next, a second image of the flipped first cross section is captured by the microscope. Subsequently, image analysis of the second image is performed to measure the second tilting shift of the structures.

In one embodiment, the first cross section is fastened to a sample holder, and the sample holder is rotated to flip the first cross section. In another embodiment, the first cross section is loaded on a sample holder without fastening the first cross section to the sample holder. The sample holder is rotated to unload the first cross section and flip the first cross section. The flipped first cross section is re-loaded on the sample holder. Note that in the case of TEM characterization, the sample holder may need to be removed from the TEM before flipping the first cross section. Consequently, the sample holder may need to be inserted into the TEM again.

In some embodiments, measuring the second tilting shift of the structures includes capturing a second image of a second cross section of the product by the microscope. The second cross section includes the structures of the second disposition. Image analysis of the second image is performed to measure the second tilting shift of the structures. Note that in the case of TEM characterization, the first cross section and the second cross section can be loaded on a single sample loader so that measurements can be done without removing the sample holder from the TEM and inserting the sample holder into the TEM between measurements.

The process 900 then proceeds to Step S930 where a first corrected tilting shift is determined based on the first tilting shift and the second tilting shift. In some embodiments, the first corrected tilting shift is determined based on a vector or scalar operation of the first tilting shift and the second tilting shift. In some embodiments, the vector or scalar operation includes obtaining a combination of the first tilting shift and the second tilting shift, such as a linear combination, $$\vec{r}_x = \frac{\vec{S1} - \vec{S2}}{2}$$

illustrated in FIGS. 6A-6F. In some embodiments, a first distortion-induced shift is determined based on a combination of the first tilting shift and the second tilting shift, such as a linear combination, $$\vec{d}_x = \frac{\vec{S1} + \vec{S2}}{2}$$

illustrated in FIGS. 6A-6F.

In some embodiments, a third tilting shift of the structures is measured by the microscope based on a third disposition of the structures. The third disposition is substantially perpendicular to the first disposition. A fourth tilting shift of the structures is measured by the microscope based on a fourth disposition of the structures. The fourth disposition is a horizontal flip of the third disposition. A second corrected tilting shift can be determined based on the third tilting shift and the fourth tilting shift.

Similar to Step S910, measuring the third tilting shift of the structures can include capturing a third image of a third cross section of the product by the microscope. The third cross section includes the structures of the third disposition. In one example, the first cross section is a vertical cross section in the xz plane, and the third cross section is a vertical cross section in the yz plane. Accordingly, the first corrected tilting shift and the second corrected tilting shift are along the x and y directions respectively.

In some embodiments, the second corrected tilting shift is determined based on a vector or scalar operation of the third tilting shift and the fourth tilting shift, such as obtaining a linear combination of the third tilting shift and the fourth tilting shift. A tilting-induced shift of the structures in the horizontal plane can also be determined based on a vector or scalar operation of the first corrected tilting shift and the second corrected tilting shift, such as a linear combination, $\vec{r}_x + \vec{r}_y$ illustrated in FIGS. 6A-6F.

In some embodiments, the microscope is a SEM, which is similar to a TEM. Descriptions have been provided above so explanations will be given with emphasis placed on difference. For a SEM, a first cross section can also be obtained to measure a first tilting shift of the structures. The first cross section has some thickness (e.g. 100 nm) and therefore has two sides. The structures (e.g. the contact structures 610) may need to be exposed on at least one side of the first cross section because electrons do not penetrate the first cross section in SEM characterization. However, for TEM characterization, the structures may be hidden within the first cross section or exposed because electrons can transmit through the first cross section.

"Device" or "semiconductor device" as used herein generically refers to any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

"Substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of tilting characterization, the method comprising:
    obtaining a first cross section of a product by one selected from the group consisting of ultramicrotomy, cryo ultramicrotomy, focused ion beam, ion etching, tripod polishing or electrochemical processing, wherein the first cross section of the product comprises a horizontal plane and structures formed in a vertical direction on the horizontal plane;
    capturing a first image of the first cross section of the product by a microscope to measure a first tilting shift of the structures based on a first disposition of the structures, wherein the first cross section includes the structures of the first disposition;
    measuring a second tilting shift of the structures based on a second disposition of the structures by the microscope, the second disposition being a horizontal flip of the first disposition; and
    determining a first corrected tilting shift based on the first tilting shift and the second tilting shift.

2. The method of claim 1, further comprising:
    performing image analysis of the first image to measure the first tilting shift of the structures.

3. The method of claim 2, wherein the measuring the second tilting shift of the structures comprises:
    flipping the first cross section to obtain a flipped first cross section that includes the structures of the second disposition;
    capturing a second image of the flipped first cross section; and
    performing image analysis of the second image to measure the second tilting shift of the structures.

4. The method of claim 2, wherein the measuring the second tilting shift of the structures comprises:
    capturing a second image of a second cross section of the product, wherein the second cross section includes the structures of the second disposition; and
    performing image analysis of the second image to measure the second tilting shift of the structures.

5. The method of claim 1, further comprising:
    determining at least one of the first corrected tilting shift or a first distortion-induced shift based on a scalar operation of the first tilting shift and the second tilting shift.

6. The method of claim 1, wherein:
    determining at least one of the first corrected tilting shift or a first distortion-induced shift based on a vector operation of the first tilting shift and the second tilting shift.

7. The method of claim 6, further comprising determining the first corrected tilting shift using a formula, $$\vec{r_1} = \frac{\vec{S1} - \vec{S2}}{2},$$

wherein:
$\vec{r_1}$ is the first corrected tilting shift,
$\vec{S1}$ is the first tilting shift, and
$\vec{S2}$ is the second tilting shift.

8. The method of claim 6, further comprising determining the first distortion-induced shift using a formula, $$\vec{d_1} = \frac{\vec{S1} + \vec{S2}}{2},$$

wherein:
$\vec{d_1}$ is the first distortion-induced shift,
$\vec{S1}$ is the first tilting shift, and
$\vec{S2}$ is the second tilting shift.

9. The method of claim 1, further comprising:
measuring a third tilting shift of the structures based on a third disposition of the structures, the third disposition being substantially perpendicular to the first disposition;
measuring a fourth tilting shift of the structures based on a fourth disposition of the structures, the fourth disposition being a horizontal flip of the third disposition; and
determining a second corrected tilting shift based on the third tilting shift and the fourth tilting shift.

10. The method of claim 9, further comprising:
determining at least one of the second corrected tilting shift or a second distortion-induced shift based on a vector operation of the third tilting shift and the fourth tilting shift.

11. The method of claim 10, further comprising:
determining a tilting-induced shift of the structures in the horizontal plane based on a vector operation of the first corrected tilting shift and the second corrected tilting shift.

12. The method of claim 11, further comprising determining the tilting-induced shift of the structures in the horizontal plane using a formula, $\vec{r_H} = \vec{r_1} + \vec{r_2}$, wherein:

$\vec{r_H}$ is the tilting-induced shift of the structures in the horizontal plane,
$\vec{r_1}$ is the first corrected tilting shift,
$\vec{r_2}$ is the second corrected tilting shift, and $$|\vec{r_H}| = |\vec{r_1} + \vec{r_2}| = \sqrt{|\vec{r_1}|^2 + |\vec{r_2}|^2}.$$

13. The method of claim 10, further comprising determining the second corrected tilting shift using a first formula, $$\vec{r_2} = \frac{\vec{S3} - \vec{S4}}{2}$$

and the second distortion-induced shift using a second formula, $$\vec{d_2} = \frac{\vec{S3} + \vec{S4}}{2},$$

wherein:
$\vec{r_2}$ is the second corrected tilting shift,
$\vec{d_2}$ is the second distortion-induced shift,
$\vec{S3}$ is the third tilting shift, and
$\vec{S4}$ is the fourth tilting shift.

14. The method of claim 9, further comprising:
determining at least one of the second corrected tilting shift or a second distortion-induced shift based on a scalar operation of the third tilting shift and the fourth tilting shift.

15. The method of claim 1, wherein the product comprises a vertical NAND memory device.

16. The method of claim 15, wherein the structures include at least one of a word line contact, a channel, a dummy channel or a gate line slit of the vertical NAND memory device.

17. The method of claim 1, wherein:
the microscope includes at least one of a transmission electron microscope (TEM), a scanning electron microscope (SEM), an X-ray microscope, an optical microscope or a fluorescence microscope.

18. The method of claim 1, wherein the first cross section has a thickness of less than 200 nm.

* * * * *